(12) United States Patent
Edelstein et al.

(10) Patent No.: US 10,276,501 B2
(45) Date of Patent: Apr. 30, 2019

(54) FORMATION OF LINER AND METAL CONDUCTOR

(71) Applicant: International Business Machines Corporation, Armonk, NY (US)

(72) Inventors: Daniel C Edelstein, White Plains, NY (US); Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/437,772

(22) Filed: Feb. 21, 2017

(65) Prior Publication Data

US 2018/0025989 A1  Jan. 25, 2018

Related U.S. Application Data

(62) Division of application No. 15/217,631, filed on Jul. 22, 2016, now Pat. No. 9,646,931.

(51) Int. Cl.
| | |
|---|---|
| *H01L 23/532* | (2006.01) |
| *H01L 21/02* | (2006.01) |
| *H01L 21/321* | (2006.01) |
| *H01L 21/768* | (2006.01) |

(52) U.S. Cl.
CPC .. *H01L 23/53238* (2013.01); *H01L 21/02247* (2013.01); *H01L 21/3212* (2013.01); *H01L 21/76826* (2013.01); *H01L 21/76831* (2013.01); *H01L 21/76843* (2013.01); *H01L 21/76855* (2013.01); *H01L 21/76883* (2013.01); *H01L 23/53209* (2013.01); *H01L 23/53223* (2013.01); *H01L 23/53252* (2013.01); *H01L 23/53266* (2013.01)

(58) Field of Classification Search
None
See application file for complete search history.

(56) References Cited

U.S. PATENT DOCUMENTS

| | | |
|---|---|---|
| 6,197,683 B1 | 3/2001 | Kang et al. |
| 6,337,289 B1 | 1/2002 | Narwanker et al. |
| 6,383,943 B1 | 5/2002 | Chen et al. |
| 6,844,258 B1 | 1/2005 | Fair et al. |
| 7,535,066 B2 | 5/2009 | Rotondaro et al. |
| 8,013,446 B2 | 9/2011 | Yang et al. |

(Continued)

OTHER PUBLICATIONS

List of IBM Patents or Patent Applications Treated as Related.

(Continued)

*Primary Examiner* — Long Pham (74) *Attorney, Agent, or Firm* — Jeffrey S LaBaw; Steven J Meyers (57) ABSTRACT

An integrated circuit device includes a substrate including a dielectric layer patterned with a set of conductive line trenches, each conductive line trench having parallel vertical sidewalls and a horizontal bottom. A liner which is an alloy of a first metal and a selected element formed at interfaces of the metal layer and a surface of the dielectric and is created by an anneal and reflow process. The first metal having a first conductivity in a pure form. A second metal layer fills the set of conductive line trenches, the second metal having a second conductivity higher than the first conductivity.

14 Claims, 11 Drawing Sheets

(56) References Cited

U.S. PATENT DOCUMENTS

| | | | |
|---|---|---|---|
| 8,420,531 B2* | 4/2013 | Yang | H01L 21/3105 |
| | | | 257/E21.584 |
| 8,530,320 B2 | 9/2013 | Yang et al. | |
| 8,673,779 B1 | 3/2014 | Yoon | |
| 2011/0057317 A1* | 3/2011 | Koike | H01L 21/28518 |
| | | | 257/751 |
| 2013/0214411 A1 | 8/2013 | Kim et al. | |
| 2013/0292806 A1 | 11/2013 | Ma | |
| 2015/0333012 A1* | 11/2015 | Chang | H01L 21/76816 |
| | | | 257/751 |
| 2016/0276150 A1 | 9/2016 | Xue | |
| 2016/0380145 A1* | 12/2016 | Fitzgerald | H01L 31/02167 |
| | | | 438/94 |

OTHER PUBLICATIONS

J. A. Wilks et al., "Nitridation of organo-silicate glass: A self-limiting process for PVD Ta 1+ x N/Ta barrier formation," Applied Surface Science, vol. 255, No. 23, 2009, pp. 9543-9547.

* cited by examiner

FORMATION OF LINER AND METAL CONDUCTOR

BACKGROUND OF THE INVENTION

This disclosure relates to integrated circuit devices, and more specifically, to a method and structure to create advanced metal conductor structures in semiconductor devices.

As the dimensions of modern integrated circuitry in semiconductor chips continues to shrink, conventional lithography is increasingly challenged to make smaller and smaller structures. With the reduced size of the integrated circuit, packaging the chips more closely together becomes important as well. By placing chips closer to each other, the performance of the overall computer system is improved.

It is typical to deposit a liner material prior to the deposition of a metal for forming a conductive line layer in semiconductor devices. In some applications, the liner material prevents the metal from diffusing into an underlying dielectric. However, as the dimensions of the features continue to shrink, the liner material takes up an increasing amount of the cross-section allocated to the conductive line. As the liner material is not as conductive as the metal, and conductivity at small cross-section dimensions is challenging, it would be advantageous to develop new technologies that reduce the effect of the liner material on conductivity.

BRIEF SUMMARY

According to this disclosure, an advanced metal conductor structure is described. An integrated circuit device includes a substrate including a dielectric layer patterned with a set of conductive line trenches, each conductive line trench having parallel vertical sidewalls and a horizontal bottom. A liner which is an alloy of a first metal and a selected element formed at interfaces of the metal layer and a surface of the dielectric and is created by an anneal and reflow process. The first metal having a first conductivity in a pure form. A second metal layer fills the set of conductive line trenches, the second metal having a second conductivity higher than the first conductivity.

The foregoing has outlined some of the more pertinent features of the disclosed subject matter. These features should be construed to be merely illustrative. Many other beneficial results can be attained by applying the disclosed subject matter in a different manner or by modifying the invention as will be described.

BRIEF DESCRIPTION OF THE DRAWINGS

For a more complete understanding of the present invention and the advantages thereof, reference is now made to the following descriptions taken in conjunction with the accompanying drawings which are not necessarily drawing to scale, and in which.

DETAILED DESCRIPTION OF THE DRAWINGS

At a high level, the invention provides a method and resulting structures to minimize the physical thickness of the liner in a conductive line layer, and thereby the liner cross-section portion of the total cross-section of the conductive line. In embodiments of the invention, this is achieved by performing a surface treatment of the patterned dielectric prior to metal deposition. In the conventional interconnect process, barrier liner(s) and conducting material are deposited separately. Also, physical thickness of the barrier liner(s) reduce volume fraction the total conducting area, which becomes a critical issue as the feature dimensions gets smaller in the modern technology nodes.

A "substrate" as used herein can comprise any material appropriate for the given purpose (whether now known or developed in the future) and can comprise, for example, Si, SiC, SiGe, SiGeC, Ge alloys, GaAs, InAs, InP, other III-V or II-VI compound semiconductors, or organic semiconductor structures. Insulators can also be used as substrates in embodiments of the invention.

For purposes herein, a "semiconductor" is a material or structure that may include an implanted impurity that allows the material to sometimes be conductive and sometimes be a non-conductive, based on electron and hole carrier concentration. As used herein, "implantation processes" can take any appropriate form (whether now known or developed in the future) and can comprise, for example, ion implantation.

For purposes herein, an "insulator" is a relative term that means a material or structure that allows substantially less (<95%) electrical current to flow than does a "conductor." The dielectrics (insulators) mentioned herein can, for example, be grown from either a dry oxygen ambient or steam and then patterned. Alternatively, the dielectrics herein may be formed from any of the many candidate high dielectric constant (high-k) materials, including but not limited to hafnium oxide, aluminum oxide, silicon nitride, silicon oxynitride, a gate dielectric stack of $SiO_2$ and $Si_3N_4$, and metal oxides like tantalum oxide that have relative dielectric constants above that of SiO2 (above 3.9). The dielectric can be a combination of two or more of these materials. The thickness of dielectrics herein may vary contingent upon the required device performance. The conductors mentioned herein can be formed of any conductive material, such as polycrystalline silicon (polysilicon), amorphous silicon, a combination of amorphous silicon and polysilicon, and polysilicon-germanium, rendered conductive by the presence of a suitable dopant. Alternatively, the conductors herein may be one or more metals, such as tungsten, hafnium, tantalum, molybdenum, titanium, or nickel, or a metal silicide, any alloys of such metals, and may be deposited using physical vapor deposition, chemical vapor deposition, or any other technique known in the art.

When patterning any material herein, the material to be patterned can be grown or deposited in any known manner and a patterning layer (such as an organic photoresist aka "resist") can be formed over the material. The patterning layer (resist) can be exposed to some form of light radiation (e.g., patterned exposure, laser exposure) provided in a light exposure pattern, and then the resist is developed using a chemical agent. This process changes the characteristic of the portion of the resist that was exposed to the light. Then one portion of the resist can be rinsed off, leaving the other portion of the resist to protect the material to be patterned. A material removal process is then performed (e.g., plasma etching) to remove the unprotected portions of the material to be patterned. The resist is subsequently removed to leave the underlying material patterned according to the light exposure pattern.

For purposes herein, "sidewall structures" are structures that are well-known to those ordinarily skilled in the art and are generally formed by depositing or growing a conformal insulating layer (such as any of the insulators mentioned above) and then performing a directional etching process (anisotropic) that etches material from horizontal surfaces at a greater rate than its removes material from vertical surfaces, thereby leaving insulating material along the vertical sidewalls of structures. This material left on the vertical sidewalls is referred to as a sidewall structure. The sidewall structures can be used as masking structures for further semiconducting processing steps.

Embodiments will be explained below with reference to the accompanying drawings.

Figure 1:
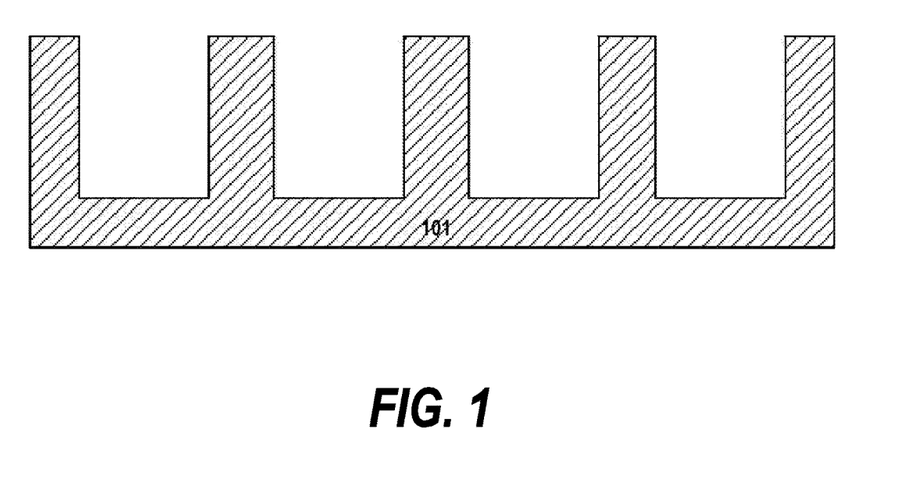
FIG. 1 is a cross-sectional diagram depicting the substrate structure after patterning and etching steps have been performed according to a first embodiment of the invention.

FIG. 1 is a cross-sectional diagram depicting the substrate structure after patterning and etching steps have been performed according to a first embodiment of the invention. As is known, a photoresist or sacrificial mandrel layer can be patterned over a dielectric layer. The subsequent etch will create the substrate structure depicted in FIG. 1. The dielectric layer 101 is silicon dioxide in preferred embodiments, however, other dielectric materials are used in other embodiments of the invention. Further, the dielectric layer 101 is preferably part of a multilayer structure comprising a plurality of materials. The conductive line pattern is a set of trenches formed in the dielectric 101 which have a set of vertical sidewalls and a set of horizontal bottoms. For ease in illustration, the trenches 102 which have been etched into the substrate are shown with a fairly low aspect ratio (H/D) of height (=H) to width (=D). In some embodiments of the invention the range of aspect ratios is 0.5 to 20 with aspect ratios of 1 to 10 being preferred. However, in the actual device, there may be high aspect ratios (Height/width) which are greater than 20:1. A typical range of heights of the dielectric conductive line pattern (or depths of the trenches) is from 100 nanometers to 2 micrometers and a typical range of width of an individual trench is 5 nanometers to 1 micrometers.

Figure 2:
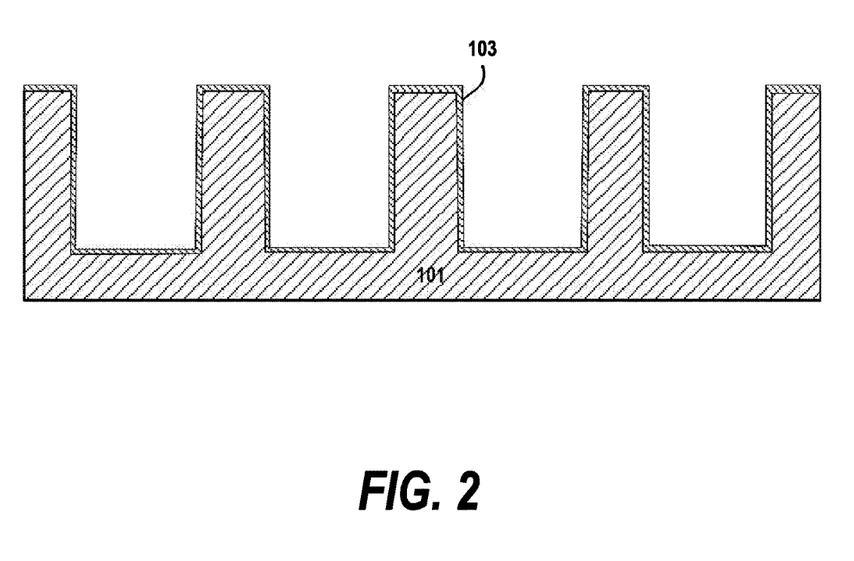
FIG. 2 is a cross-sectional diagram depicting the substrate structure after a surface treatment step has been performed according to a first embodiment of the invention.

FIG. 2 is a cross-sectional diagram depicting the structure after a surface treatment step has been performed according to a first embodiment of the invention. In the drawing, a surface treatment has been performed on the dielectric substrate resulting in an element enriched surface layer 103. The element enriched surface layer 103 is created on the sidewalls and bottom of the dielectric utilizing a plasma or thermal process which increases the concentration of a selected element in a surface portion of the dielectric. It is important to note that the treatment of the surface portion of the dielectric takes place in the dielectric layer itself and takes little, if any, additional cross-section. In one preferred embodiment, the surface treatment is a nitridation process and results in the formation of a nitrogen-enriched dielectric surface. The nitridation process is performed as a substitute to the deposition of a traditional liner material. Since the nitrogen-enriched dielectric surface takes little to no cross section from the trench cross-section and is instead formed from the dielectric material, a greater cross-section can be devoted to the metal of the conductive lines as compared to prior art methods of protecting the dielectric from the diffusion of the metal of the conductive lines.

The thermal nitridation process employed in embodiments of the present invention disclosure does not include an electrical bias higher than 200 W in a nitrogen-containing gas or gas mixture. The nitrogen-containing gases that can be employed in the present invention include, but are not limited to, N2, NH3, NH4, NO, and NHx wherein x is between 0 and 1 or mixtures thereof. In some embodiments, the nitrogen-containing gas is used neat, i.e., non-diluted. In other embodiments, the nitrogen-containing gas can be diluted with an inert gas such as, for example, He, Ne, Ar and mixtures thereof. In some embodiments, H2 can be used to dilute the nitrogen-containing gas. The nitrogen-containing gas employed in the present disclosure is typically from 10% to 100%, with a nitrogen content within the nitrogen-containing gas from 50% to 80% being more typical. In one embodiment, the thermal nitridation process employed in the present disclosure is performed at a temperature from 50° C. to 450° C. In another embodiment, the thermal nitridation process employed in the present disclosure is performed at a temperature from 100° C. to 300° C. for 30 minutes to 5 hours. In one set of embodiments, the resulting nitride enhanced layer is between 2 angstroms to 30 angstroms thick, but alternative embodiments can have thicknesses outside this range.

In some embodiments, a N2 plasma process is used to create the nitride layer which involves an electrical bias higher than 350 W. An N2 plasma can be controlled without damaging the dielectric with ion current density range: 50~2000 uA/cm2, and process temperature between 80 and 350 degrees C.

In other embodiments, other chemicals containing Si, C, and O or mixtures thereof can be used for the surface treatment. For example SiHx could be a source for Si, CHx could be a source for C, and O3 is a source for O. Both thermal and plasma techniques can be used for the treatment. The thickness of the element enriched layer 103 can vary according to the type of metal layer being formed and the technique used in forming the same. Typically, the layer 103 has a thickness from 2 angstroms to 10 nm, with a thickness from 1 nm to 3 nm being more typical. The element enriched layer 103 prevents the diffusion of the subsequent metal layer into the dielectric.

Figure 3:
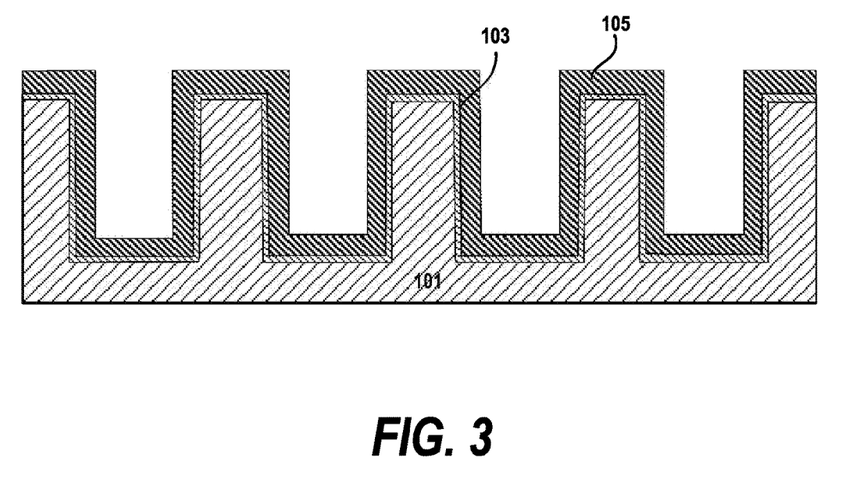
FIG. 3 is a cross-sectional diagram depicting the structure after a metal deposition step has been performed according to a first embodiment of the invention.

FIG. 3 is a cross-sectional diagram depicting the structure after a metal deposition step has been performed according to a first embodiment of the invention. Metals such as Al, Co, Ru, Ir, Rh, W, Mn or Ni can be deposited in this step. In one preferred embodiment, Al is used. The aluminum layer 105 (or alternative metal) can be formed by a conventional deposition process including, for example, chemical vapor deposition (CVD), plasma enhanced chemical vapor deposition (PECVD), atomic layer deposition (ALD), physical vapor deposition (PVD), sputtering, chemical solution deposition and plating. In preferred embodiments, the thickness of the Al layer 105 is at least sufficient to fill the trench area after a subsequent thermal anneal step reflows the Al layer. In preferred embodiments, the thickness of the Al layer will be in the range of 5 angstroms to 500 angstroms, with a thickness from 10 angstroms to 200 angstroms being more typical. Greater thicknesses can be used in alternative embodiments, however, at a cost of time and materials when the unreacted metal is removed in subsequent steps. As illustrated, the metal deposition is substantially conformal over the element enriched layer 103, however, a conformal layer is not a requirement of the invention.

Figure 4:
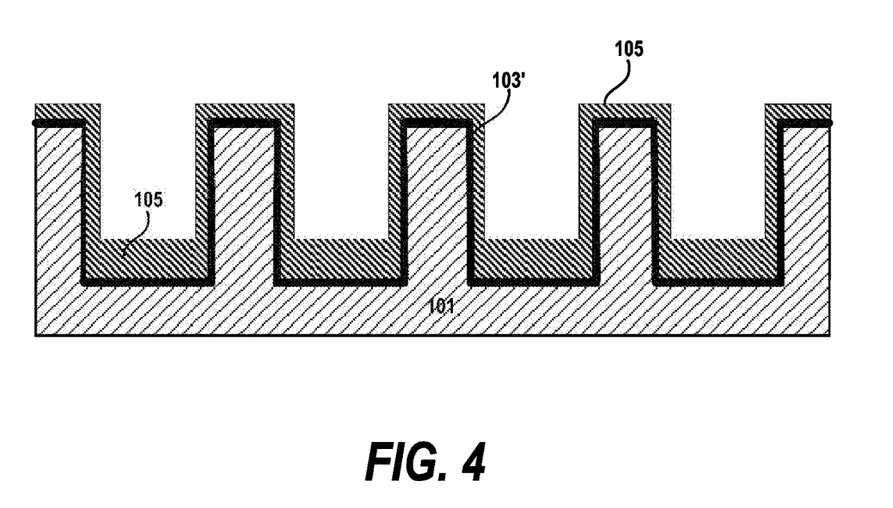
FIG. 4 is a cross-sectional diagram depicting the structure after a thermal anneal step has been performed according to a first embodiment of the invention.

FIG. 4 is a cross-sectional diagram depicting the structure after a thermal anneal step has been performed according to a first embodiment of the invention according to an embodiment of the invention. The surface treatment step described above forms the element enriched layer 103, wherein a selected element's concentration has been enhanced in the dielectric. The thermal anneal creates a chemical change at the interface between the Al layer 105 and the element enriched layer 103 creating an alloy liner 103' of Al and the selected element. In alternative embodiments, an alloy of the selected metal and the selected element is formed. For example, if a nitridation process was performed and the deposited metal is Al, an aluminum nitride layer 103' such as AlN is formed by the anneal. If the dielectric material 101 contains Si, a silicon containing aluminum nitride liner layer 103' such as Al(N, Si) is formed. Alternatively, if the dielectric material 101 does not contain Si, but the chemical used for the surface treatment contains both N and Si, an Al(N, Si) liner layer 103' is also formed. In the general case, if C is the selected element in the embodiment and M is the deposited metal, an MC liner layer 103' is formed.

In one preferred embodiment, the thermal anneal is carried out in a furnace between a temperature range between 100-500 degrees Centigrade in a neutral ambient, for example, in an N2, 112, He ambient or mixture thereof. The thermal anneal is carried out for a period of 30 minutes to 5 hours in embodiments of the invention. In another embodiment, the thermal anneal is carried out through laser annealing. 20 nanoseconds to 5 minutes, 300-900 degrees Centigrade using a similar ambient.

The thermal anneal also reflows the aluminum (or other selected metal in other embodiments) from the field area into the patterned conductive line features due to capillary driving force. Thus, the thermal anneal step simultaneously forms both a new type of protective liner, for example, Al(N, Si), and the conductor lines (by reflow). The reflow process not only forms an Al—N liner simultaneously, but has better feature fill quality than the normal deposition. Because the liner is disposed in the cross section allocated to the dielectric layer, there is a greater cross-section allocated to the conductive line. The deeper the feature the more challenge for metal fill, i.e. manufacturability.

Although the embodiment described above has mostly been described in terms of a nitridation process to change the surface of the dielectric layer and aluminum as the metal fill material for the conductive lines, the reader should understand that any permutation of a surface treatment using N, Si, C, and O or mixtures thereof and of Al, Co, Ru, Ir, Rh, W, Mn or Ni or mixtures thereof for the first fill metal is possible for embodiments of the invention depending on the conductive characteristics desired for the conductive line and the composition of the dielectric substrate. Some combinations of metal and selected element, in addition to Al(N, Si) and AlN, which are desirable in different embodiments of the invention include Co (N, Si), Rh (N, Si), Ru (N, Si), Mn(N, Si) and Ni (N, Si).

Figure 5:
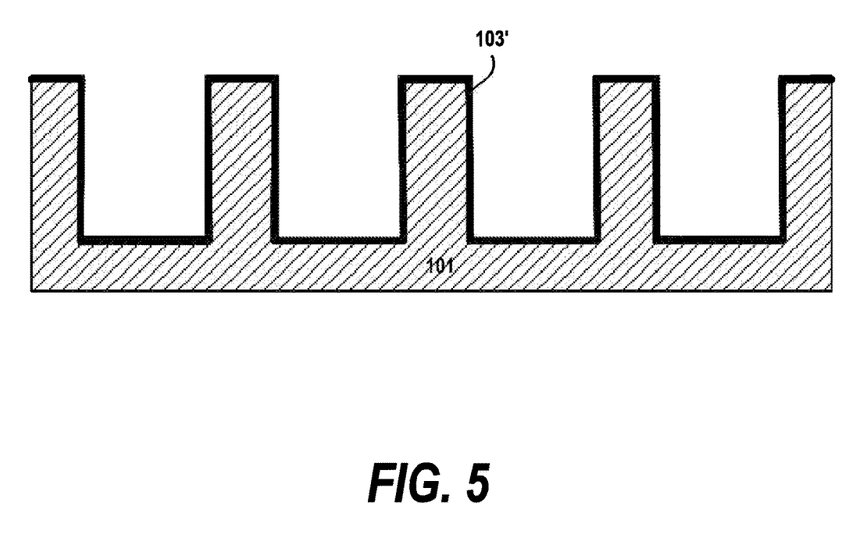
FIG. 5 is a cross-sectional diagram depicting the structure after an etch step has been performed according to a first embodiment of the invention.

FIG. 5 is a cross-sectional diagram depicting the structure after an etch step has been performed according to a first embodiment of the invention. The first metal is selectively removed from the structure. In particular, the portion of the non-reacted first metal is selectively removed and the portion of the first metal which has reacted and formed the alloy liner on the patterned dielectric. The first metal is removed in favor of a second metal having a better (higher) conductivity than the first metal used to create the liner. An etch or other removal process is chosen which will selectively remove the non-reacted metal while leaving the newly created alloy liner intact. In the embodiment above, an etch which removes the Al, but etches AlN or Al(N, Si) at a slow rate is desired. In one embodiment, a plasma aided etch, such as reactive ion etching (RIE) using an etchant containing fluorine or chlorine is used. In other embodiments, a wet etch using an acid selected from the group of hydrogen fluoride, hydrogen chloride, sulfuric acid, nitric acid is used. Because the alloy liner is formed in the cross-section allocated to the dielectric, more cross-section can be allocated to the metal line, increasing conductivity.

Figure 6:
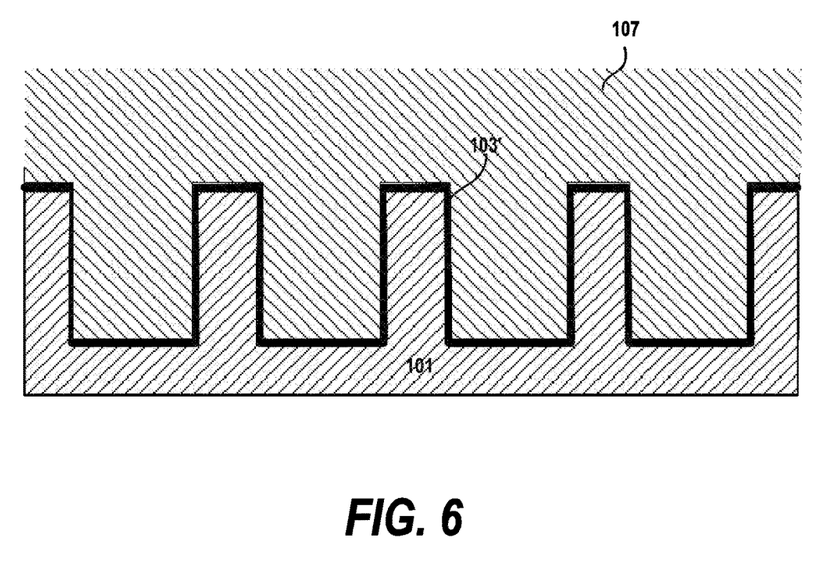
FIG. 6 is a cross-sectional diagram depicting the structure after a metal deposition step has been performed according to a first embodiment of the invention.

FIG. 6 is a cross-sectional diagram depicting the structure after a Cu deposition step has been performed according to a first embodiment of the invention. The deposition of the copper layer 107 can be formed over the Al(N, Si) layer 103' utilizing any conventional deposition process including, for example, chemical vapor deposition (CVD), plasma enhanced chemical vapor deposition (PECVD), physical vapor deposition (PVD), sputtering, plating, chemical solution deposition, electroless plating, or combination of the same. The thickness of the copper layer can vary depending on the depth of the trench and the technique used in forming the copper layer. The thickness of the copper layer is selected to be sufficient to fill a remainder portion of the conductive line trenches, i.e. that portion which has not already been filled by the first metal layer. Typically, the copper layer 107 has an overburden thickness from 100 nm to 1000 nm, with a thickness from 300 nm to 800 nm being more typical. The overburden thickness (or area) is the Cu thickness above the top of the patterned features. In alternative embodiments, a different second metal such as Co, W, Ir, Rh, Ni or Ru can be used instead of the Cu layer 107. It is known that the electrical conductivity of metal materials vary with their dimensions. In preferred embodiments, a feature dimension range of 5 nm to 200 nm, or preferably a range of 10 nm to 100 nm, the selected second metal 107 has a higher conductivity than the first metal 105 used for creating the alloy liner. These metals can be deposited using the same types of deposition processes used for deposition of the copper.

Figure 7:
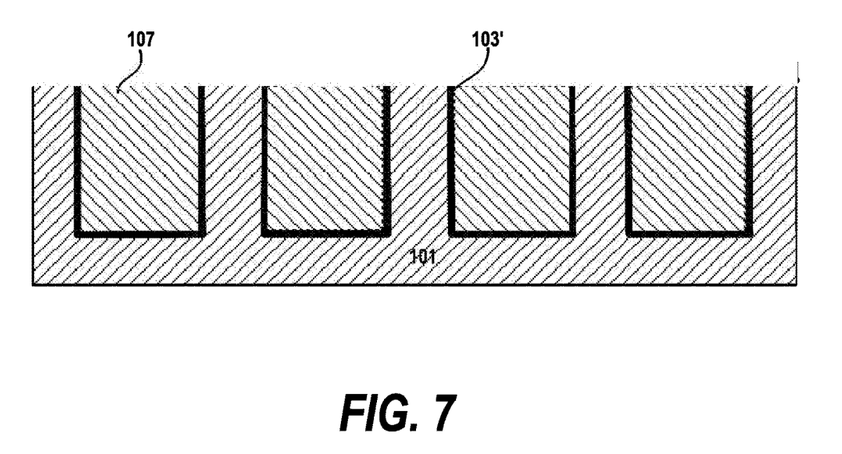
FIG. 7 is a cross-sectional diagram depicting the structure after a planarization step has been performed according to a first embodiment of the invention.

FIG. 7 is a cross-sectional diagram depicting the structure after a planarization step has been performed according to a first embodiment of the invention. The drawing depicts the structure after a planarization process such as a chemical mechanical polishing (CMP) step has been performed according to a first embodiment of the invention. Typically, a CMP process uses an abrasive and corrosive chemical slurry (commonly a colloid) in conjunction with a polishing pad. The pad and wafer are pressed together by a dynamic polishing head and held in place by a plastic retaining ring. As shown, the CMP step has removed the excess portions of the alloy layer 103' and Cu layer 107 in the field areas of the dielectric layer outside the trenches of conductive line pattern in the dielectric 101. In preferred embodiments of the invention, the liner layer is also removed from the field areas of the dielectric where it is not needed. Other planarization processes are known to the art and are used in alternative embodiments of the invention.

Processing of additional layers of the integrated circuit device proceeds after the steps illustrated in the disclosure. For example, a second set of conductive lines could be created using an embodiment of the invention in subsequent steps if required for completion of the integrated circuit.

Figure 8:
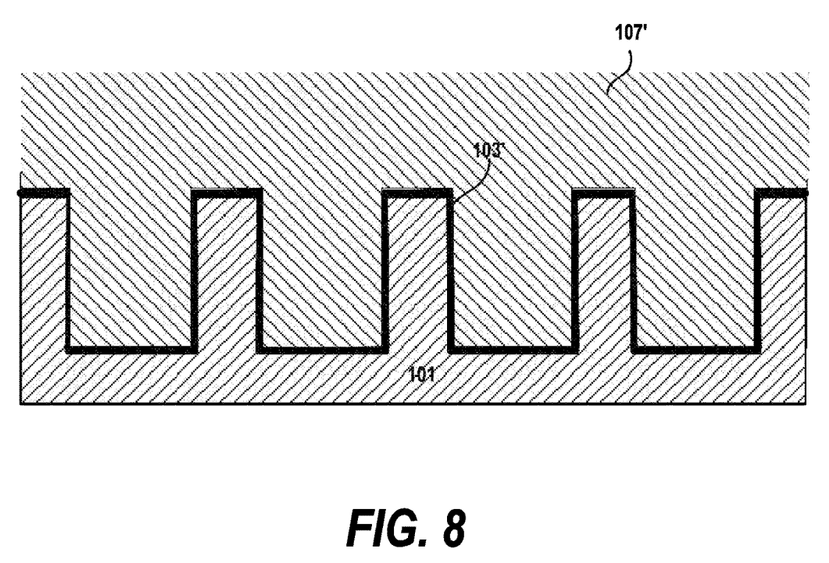
FIG. 8 is a cross-sectional diagram depicting the structure after a CuMn deposition step has been performed according to a second embodiment of the invention.

FIG. 8 is a cross-sectional diagram depicting the structure after a CuMn deposition step has been performed according to a second embodiment of the invention. As depicted, the processing of FIGS. 1-4 have already occurred. In this embodiment, a manganese containing alloy, such as CuMn, is used as the second layer metal rather than the materials discussed above with reference of FIG. 5. The deposition of the copper manganese layer 107' can be formed over the aluminum alloy layer 103' utilizing any conventional deposition process including, for example, chemical vapor deposition (CVD), plasma enhanced chemical vapor deposition (PECVD), physical vapor deposition (PVD), sputtering, plating, chemical solution deposition, electroless plating, or combination of the same. The thickness of the copper layer can vary depending on the depth of the trench and the technique used in forming the copper layer. Typically, the copper manganese layer 107' has an overburden thickness from 100 nm to 1000 nm, with a thickness from 300 nm to 800 nm being more typical. The overburden thickness (or area) is the CuMn thickness above top of the patterned features. In alternative embodiments, a different second manganese alloy such as CoMn, WMn, IrMn, RhMn, NiMn or RuMn can be used instead of the CuMn layer 107'. The alloys are chosen such that the non-manganese component has a better conductivity than the first metal. These alloys can be deposited using the same types of deposition processes used for deposition of the copper in other embodiments discussed above.

Figure 9:
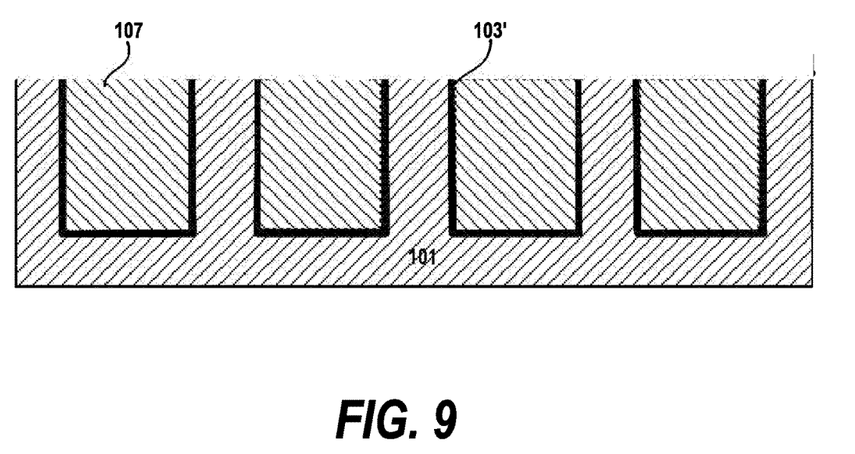
FIG. 9 is a cross-sectional diagram depicting the structure after an anneal step and a planarization step has been performed according to a second embodiment of the invention.

FIG. 9 is a cross-sectional diagram depicting the structure after an anneal step and a planarization step has been performed according to a second embodiment of the invention. The planarization step removes excess metal in the field areas of the dielectric. The process conditions used in preferred embodiments of the invention are similar to those described above in connection with the first embodiment. As compared to the first embodiment depicted in FIG. 6, the Mn has been driven into the protective liner 103' so that an Al(N, Si, Mn) alloy is formed. There is an advantage to using a manganese alloy as the Mn, once incorporated into the liner by the anneal, further enhances the barrier property of the liner. Mn tends to react with oxygen (O) and/or nitrogen (N) in the dielectric to form a stable Mn(O, N). If the thermal annealing is long enough to reach a thermal equilibrium, all Mn will react with oxygen (O) and/or nitrogen (N) on the dielectric surface. In a practical case, there is a small amount of Mn left in the Cu after anneal.

Figure 10:
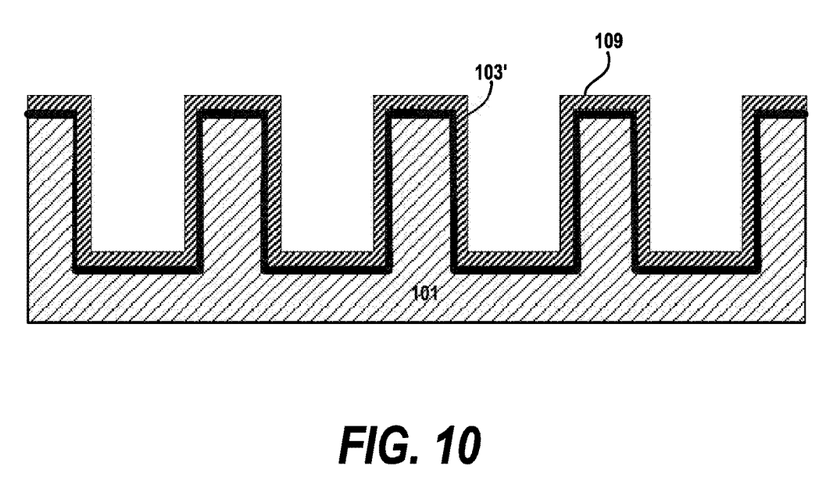
FIG. 10 is a cross-sectional diagram depicting the structure after a barrier layer deposition step has been performed according to a third embodiment of the invention.

FIG. 10 is a cross-sectional diagram depicting the structure after a barrier layer deposition step has been performed according to a third embodiment of the invention. As depicted, the processing of FIGS. 1-4 have already occurred, i.e. the steps of the first embodiment up to the thermal anneal are performed. Next, a barrier layer material selected from the group of Ta, Ti, Co, Ni, W, Ru and their nitrides is deposited. The barrier layer material 109 is deposited over the alloy layer 103' utilizing any conventional deposition process including, for example, chemical vapor deposition (CVD), plasma enhanced chemical vapor deposition (PECVD), physical vapor deposition (PVD), sputtering, plating, chemical solution deposition and electroless plating. The thickness of the layer 109 can vary according to the type of layer being formed and the technique used in forming the same. Typically, the barrier layer 109 has a thickness from 1 nm to 20 nm, with a thickness from 2 nm to 10 nm being more typical. The barrier layer material 109 prevents the diffusion of the subsequent metal layer into the dielectric 101, acting as an additional protective layer in addition to protective liner layer 103.

Figure 11:
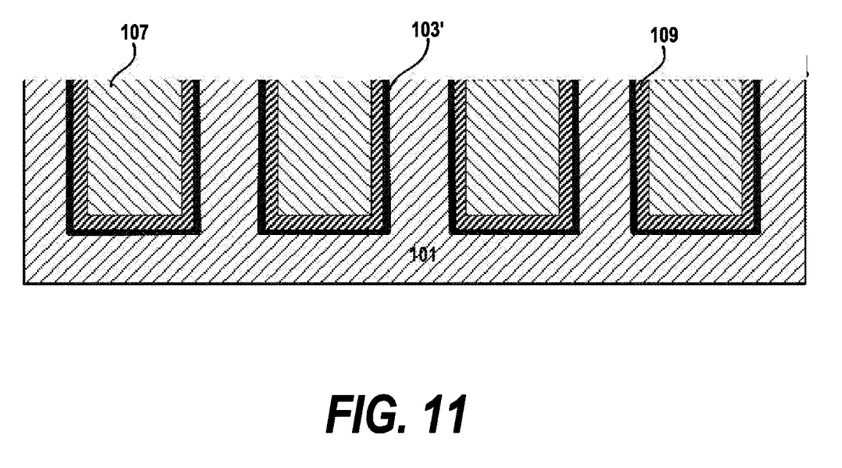
FIG. 11 is a cross-sectional diagram depicting the structure after a copper deposition step and a planarization step have been performed according to a third embodiment of the invention.

FIG. 11 is a cross-sectional diagram depicting the structure after a Cu deposition step and a planarization step have been performed according to a third embodiment of the invention. This step is similar to the Cu deposition in the first embodiment described above. Also, as described in the first embodiment, other metals such as Co, W, Ir, Rh, Ni or Ru could be used as the second metal layer. The planarization process is similar to that described above in connection with the first and second embodiments and removes excess metal in the field areas of the dielectric. As compared to the first embodiment, the third embodiment offers greater protection against diffusion into the dielectric 101 from the second metal layer 107 as both the barrier layer 109 and the protective liner layer 103' guard against diffusion of the second metal 107. Because of the protective liner layer 103', the barrier layer 109 can be thinner than prior art processes.

The resulting structure can be included within integrated circuit chips, which can be distributed by the fabricator in wafer form (that is, as a single wafer that has multiple chips), as a bare die, or in a packaged form. In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

While only one or a limited number of features are illustrated in the drawings, those ordinarily skilled in the art would understand that many different types of features could be simultaneously formed with the embodiment herein and the drawings are intended to show simultaneous formation of multiple different types of features. However, the drawings have been simplified to only show a limited number of features for clarity and to allow the reader to more easily recognize the different features illustrated. This is not intended to limit the invention because, as would be understood by those ordinarily skilled in the art, the invention is applicable to structures that include many of each type of feature shown in the drawings.

While the above describes a particular order of operations performed by certain embodiments of the invention, it should be understood that such order is exemplary, as alternative embodiments may perform the operations in a different order, combine certain operations, overlap certain operations, or the like. References in the specification to a given embodiment indicate that the embodiment described may include a particular feature, structure, or characteristic, but every embodiment may not necessarily include the particular feature, structure, or characteristic.

In addition, terms such as "right", "left", "vertical", "horizontal", "top", "bottom", "upper", "lower", "under", "below", "underlying", "over", "overlying", "parallel", "perpendicular", etc., used herein are understood to be relative locations as they are oriented and illustrated in the drawings (unless otherwise indicated). Terms such as "touching", "on", "in direct contact", "abutting", "directly adjacent to", etc., mean that at least one element physically contacts another element (without other elements separating the described elements).

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

Having described our invention, what we now claim is as follows:

1. An integrated circuit device comprising:
a substrate including a dielectric layer patterned with a set of conductive line trenches, each conductive line trench having parallel vertical sidewalls and a horizontal bottom, wherein the vertical sidewalls and horizontal bottoms have an element enriched surface layer in which a concentration of a selected element is increased relative to a remainder of the dielectric layer;
a liner which is an alloy of a first metal and the selected element, the liner formed in the element enriched surface layer of the dielectric layer, the first metal having a first conductivity in a pure form, the liner being a first barrier layer; and
a second metal layer comprised of a second metal, the second metal layer in contact with the liner formed in the dielectric layer, the second metal layer entirely filling the set of conductive line trenches, the second metal having a second conductivity higher than the first conductivity.

2. The device as recited in claim 1 wherein the first metal is aluminum and the selected element is nitrogen.

3. The device as recited in claim 2, wherein the liner is comprised of an alloy selected from the group consisting of AlN and Al(N, Si), and Al(N, Si, Mn).

4. The device as recited in claim 1, wherein the first metal is comprised of a metal selected from the group consisting of Al, Co, Ru, Ir, Rh, W, Mn and Ni.

5. The device as recited in claim 1, wherein the selected element is selected from the group consisting of N, Si, C, and O.

6. The device as recited in claim 1, wherein the second metal layer in the set of conductive lines trenches has a top surface which is coplanar with a top surface of the dielectric in field areas of the dielectric layer.

7. The device as recited in claim 1 wherein the liner is comprised of an alloy AB wherein A is a metal selected from the group consisting of Al, Co, Ru, Ir, Rh, Mn, Ni and B is a selected element selected from the group consisting of N, Si, C, and O.

8. The device as recited in claim 1 further comprised of a second barrier layer disposed between the liner and the second metal layers.

9. The device as recited in claim 1 wherein the liner is further comprised of a manganese alloy.

10. An integrated circuit device comprising:
a substrate including a dielectric layer patterned with a set of conductive line trenches, each conductive line trench having parallel vertical sidewalls and a horizontal bottom, wherein the vertical sidewalls and horizontal bottom have an element enriched surface layer in which the concentration of a selected element is increased relative to a remainder of the dielectric layer;
a liner which is an alloy of a first metal and the selected element, the liner formed in the element enriched surface layer of the dielectric layer, the first metal having a first conductivity in a pure form; and
a second metal layer in contact with the liner formed in the dielectric layer and filling the set of conductive line trenches, the second metal layer having a rectangular cross-section and a top surface coplanar with a top surface of the dielectric layer, the second metal having a second conductivity higher than the first conductivity.

11. The device as recited in claim 10, wherein the liner is a barrier layer to diffusion.

12. The device as recited in claim 10, wherein each of the set of conductive lines is formed from a single layer of the second metal.

13. The device as recited in claim 10, wherein the first metal is comprised of a metal selected from the group consisting of Co, Ru, Ir, Rh, W, Mn and Ni.

14. The device as recited in claim 10, wherein the selected element is selected from the group consisting of C and O.

* * * * *